(12) United States Patent
Liao et al.

(10) Patent No.: US 10,615,087 B2
(45) Date of Patent: Apr. 7, 2020

(54) SEMICONDUCTOR WAFER WITH TEST KEY STRUCTURE

(71) Applicant: Winbond Electronics Corp., Taichung (TW)

(72) Inventors: Hsiu-Han Liao, Hsinchu (TW); Che-Fu Chuang, Pitou Township, Changhua County (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 16/155,496

(22) Filed: Oct. 9, 2018

(65) Prior Publication Data

US 2019/0181063 A1 Jun. 13, 2019

(30) Foreign Application Priority Data

Dec. 11, 2017 (TW) .............................. 106143332 A

(51) Int. Cl.
*H01L 21/66* (2006.01)
*H01L 23/544* (2006.01)
*H01L 23/58* (2006.01)
*H01L 23/00* (2006.01)

(52) U.S. Cl.
CPC .............. *H01L 22/32* (2013.01); *H01L 22/34* (2013.01); *H01L 23/544* (2013.01); *H01L 23/562* (2013.01); *H01L 23/564* (2013.01); *H01L 23/585* (2013.01); *H01L 2223/5446* (2013.01)

(58) Field of Classification Search
CPC ....... H01L 21/66; H01L 23/00; H01L 23/544; H01L 23/58
See application file for complete search history.

(56) References Cited

U.S. PATENT DOCUMENTS

| | | | | |
|---|---|---|---|---|
| 5,751,554 A | * | 5/1998 | Williams | ................ H01L 22/32 174/260 |
| 2003/0168715 A1 | * | 9/2003 | Bae | ...................... H01L 23/5258 257/529 |
| 2009/0057842 A1 | * | 3/2009 | He | .......................... H01L 22/32 257/620 |
| 2015/0061713 A1 | * | 3/2015 | Shia | .................... G01R 1/06733 324/750.16 |
| 2015/0262897 A1 | * | 9/2015 | Chen | ....................... H01L 22/32 257/48 |
| 2016/0064294 A1 | * | 3/2016 | Reber | ..................... H01L 24/02 257/499 |

FOREIGN PATENT DOCUMENTS

TW 200617553 A 6/2006

\* cited by examiner

*Primary Examiner* — Sheng-Bai Zhu

(74) *Attorney, Agent, or Firm* — Muncy, Geissler, Olds & Lowe, PC

(57) ABSTRACT

A semiconductor wafer with a test key structure is provided. The semiconductor wafer includes a semiconductor substrate including a scribe line region, a chip region, and a seal ring region between the scribe line region and the chip region. A test pad structure and a test element are disposed over the semiconductor substrate corresponding to the scribe line region. A conductive line is disposed over the semiconductor substrate corresponding to the seal ring region, and has two ends extending to the scribe line region and electrically connected between the test pad structure and the test element.

17 Claims, 6 Drawing Sheets

SEMICONDUCTOR WAFER WITH TEST KEY STRUCTURE

CROSS REFERENCE TO RELATED APPLICATIONS

This application claims priority of Taiwan Patent Application No. 106143332, filed on Dec. 11, 2017, the entirety of which is incorporated by reference herein.

BACKGROUND

Field of the Disclosure

The disclosure relates to a semiconductor wafer, and in particular to a semiconductor wafer with a test key structure that is capable of increasing the available area of the semiconductor wafer.

Description of the Related Art

Generally speaking, test key structures are disposed in the scribe line regions. A test key structure includes test pads and test elements, and is fabricated simultaneously with the formation of actual or functional devices in the semiconductor chips. As a result, the quality of the actual or functional devices can be checked by electrically connecting the test probes to the test pads of a test key structure.

However, with the development of complicated circuits on the semiconductor chips, more test pads and more test elements are required on the scribe line regions, and thus each of the scribe line regions may get broader.

SUMMARY

An exemplary embodiment of a semiconductor wafer with a test key structure is provided. The semiconductor wafer includes a semiconductor substrate including a scribe line region, a chip region, and a seal ring region between the scribe line region and the chip region. A first test pad structure and a first test element are disposed over the semiconductor substrate corresponding to the scribe line region. A first conductive line is disposed over the semiconductor substrate corresponding to the seal ring region, and has two ends extending to the scribe line region and electrically connected between the first test pad structure and the first test element.

Another exemplary embodiment of a semiconductor wafer with a test key structure is provided. The semiconductor wafer includes a semiconductor substrate including a first seal ring region, a second seal ring region, and a scribe line region between the first seal ring region and the second seal ring region. A first test pad structure, a second test pad structure, a first test element, and a second test element are disposed over the semiconductor substrate corresponding to the scribe line region. A first conductive line is disposed over the semiconductor substrate corresponding to the first seal ring region, and has two ends extending to the scribe line region and electrically connected between the first test pad structure and the first test element. A second conductive line is disposed over the semiconductor substrate corresponding to the second seal ring region, and has two ends extending to the scribe line region and electrically connected between the second test pad structure and the second test element.

Yet another exemplary embodiment of a semiconductor wafer with a test key structure is provided. The semiconductor wafer includes a semiconductor substrate including a first scribe line region, a second scribe line region perpendicular to the first scribe line region, and a seal ring region between the first scribe line region and the second scribe line region. A first test pad structure and a first test element are disposed over the semiconductor substrate corresponding to the first scribe line region. A second test pad structure and a second test element are disposed over the semiconductor substrate corresponding to the second scribe line region. A first conductive line is disposed over the semiconductor substrate corresponding to the seal ring region, and has two ends respectively extending to the first scribe line region and the second scribe line region, and electrically connected between the first test element and the second test pad structure. A second conductive line is disposed over the semiconductor substrate corresponding to the seal ring region, and has two ends respectively extending to the first scribe line region and the second scribe line region, and electrically connected between the first test pad structure and the second test element.

BRIEF DESCRIPTION OF THE DRAWINGS

The present disclosure can be further understood by reading the subsequent detailed description and examples with references made to the accompanying drawings, wherein.

DETAILED DESCRIPTION

The embodiments provide a semiconductor wafer with a test key structure. The semiconductor wafer employs the seal ring region between the scribe line region and the chip region for placement of the trace route of the test key structure, thereby effectively reducing the width of the scribe line region. Moreover, by forming openings in the test pad of the test key structure, the stress generated by performing dicing process and the area of the test pad are reduced.

Figure 1:
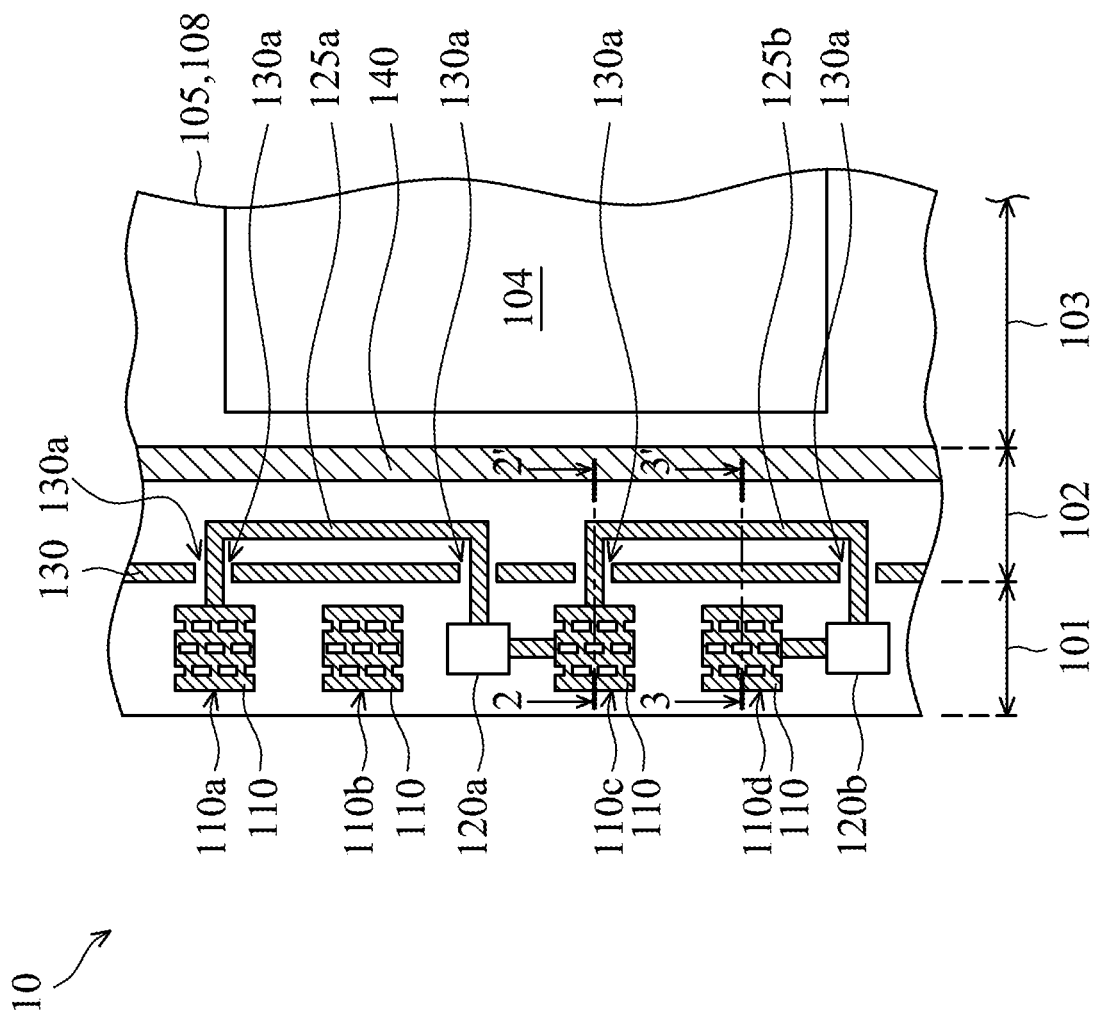
FIG. 1 is a plan view of a portion of a semiconductor wafer with a test key structure according to some embodiments of the present invention.
Figure 2:
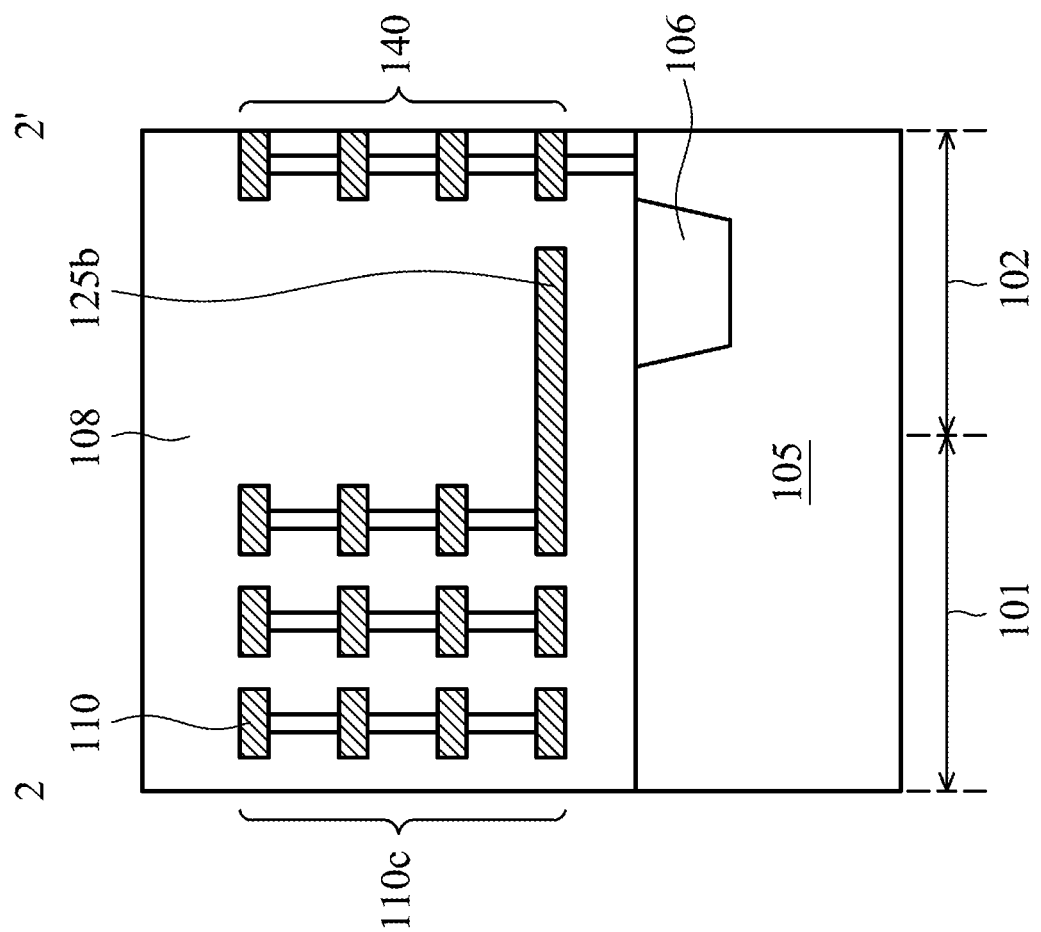
FIG. 2 is a cross-sectional view taken along the line 2-2' in FIG. 1.
Figure 3:
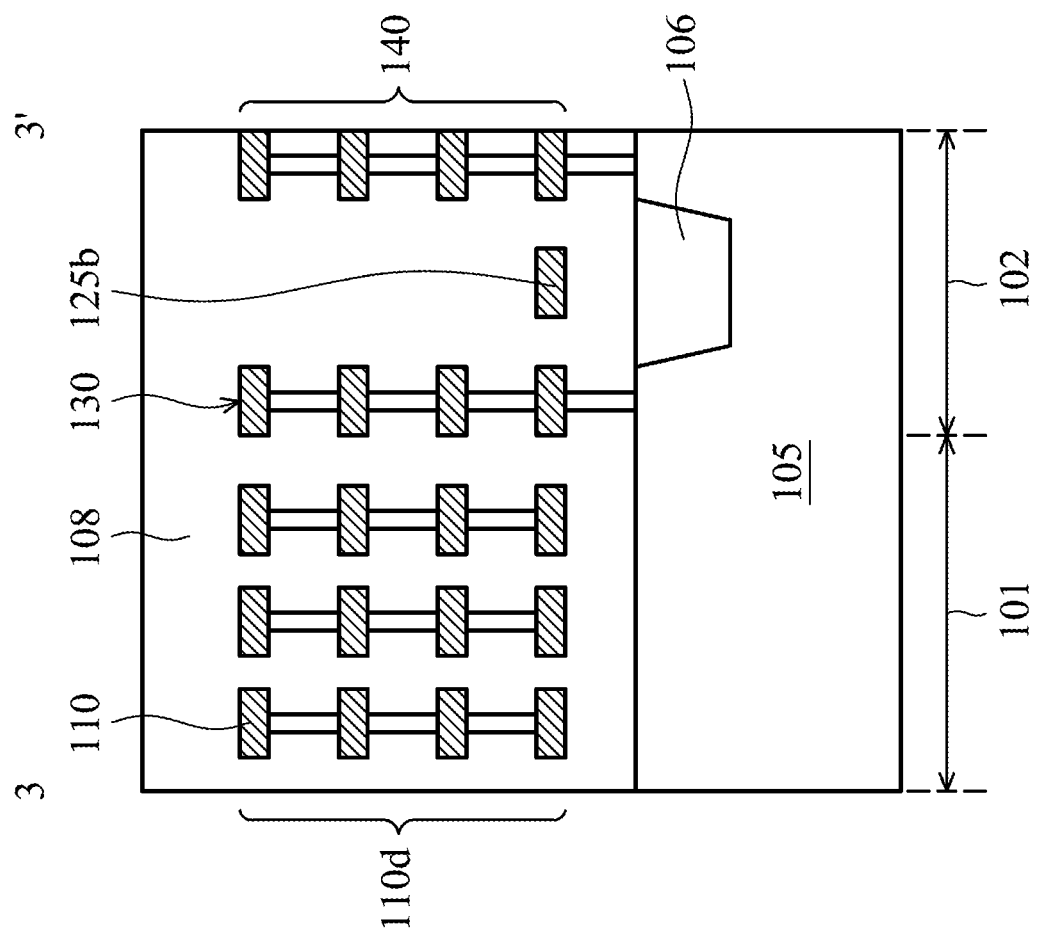
FIG. 3 is a cross-sectional view taken along the line 3-3' in FIG. 1.

Refer to FIGS. 1, 2, and 3, in which FIG. 1 is a plan view of a portion of a semiconductor wafer 10 with a test key structure according to some embodiments of the present invention, FIG. 2 is a cross-sectional view taken along the line 2-2' in FIG. 1. In some embodiments, and FIG. 3 is a cross-sectional view taken along the line 3-3' in FIG. 1. In some embodiments, the semiconductor wafer 10 with a test key structure includes a semiconductor substrate 105, such as a silicon substrate, a SiGe substrate, a bulk semiconductor substrate, a compound semiconductor substrate, a silicon-on-insulator (SOI) substrate, or another well-known semiconductor substrate. The semiconductor substrate 105 includes at least one scribe line region 101, at least one chip region 103, and a seal ring region 102 therebetween. In some embodiment, the seal ring region 102 surrounds the chip region 103. Moreover, the semiconductor substrate 105 corresponding to the seal ring region 102 has an isolation structure (such as a shallow trench isolation structure) therein, as shown in FIGS. 2 and 3. The isolation structure also surrounds the chip region 103.

In some embodiments, the semiconductor wafer 10 with a test key structure further includes test pad structures and test elements disposed in a dielectric layer 108 over the semiconductor substrate 105, as shown in FIGS. 2 and 3, and located at the scribe line region 101. The dielectric layer 108 may include borosilicate glass (BSG), phosphosilicate glass (PSG), boron-doped phosphosilicate Glass (BPSG), fluoride-doped silicate glass (FSG), a low-k dielectric material, another porous dielectric material, or a combination thereof. In some embodiments, and may be formed by a chemical vapor deposition (CVD) process, a spin-on process, or a combination thereof.

It should be understood that the number of those test pad structures and test elements is based on the design demands. Herein, in order to simplify the diagram, only four test pad structures 110a, 110b, 110c, and 110d and two test elements 120a and 120b are depicted. In some embodiments, from a top-view perspective, the test pad structures 110a, 110b, 110c, and 110d and the test elements 120a and 120b are arranged along a central line (not shown). As shown in FIGS. 2 and 3, the test pad structures 110a, 110b, 110c, and 110d may be formed by multi-metal layer structures. It should be understood that the number of metal layers and the number of conductive plugs in the multi-metal layer structure are based on the design demands and are not limited to the embodiments shown in FIGS. 2 and 3. For example, the test pad structures 110a, 110b, 110c, and 110d respectively include metal layers in different levels of the dielectric layer 108 and conductive plugs connected between the metal layers. The uppermost metal layer in the stack of the metal layers may serve as a test pad 110 for contacting a test probe head (not shown).

Figure 4:
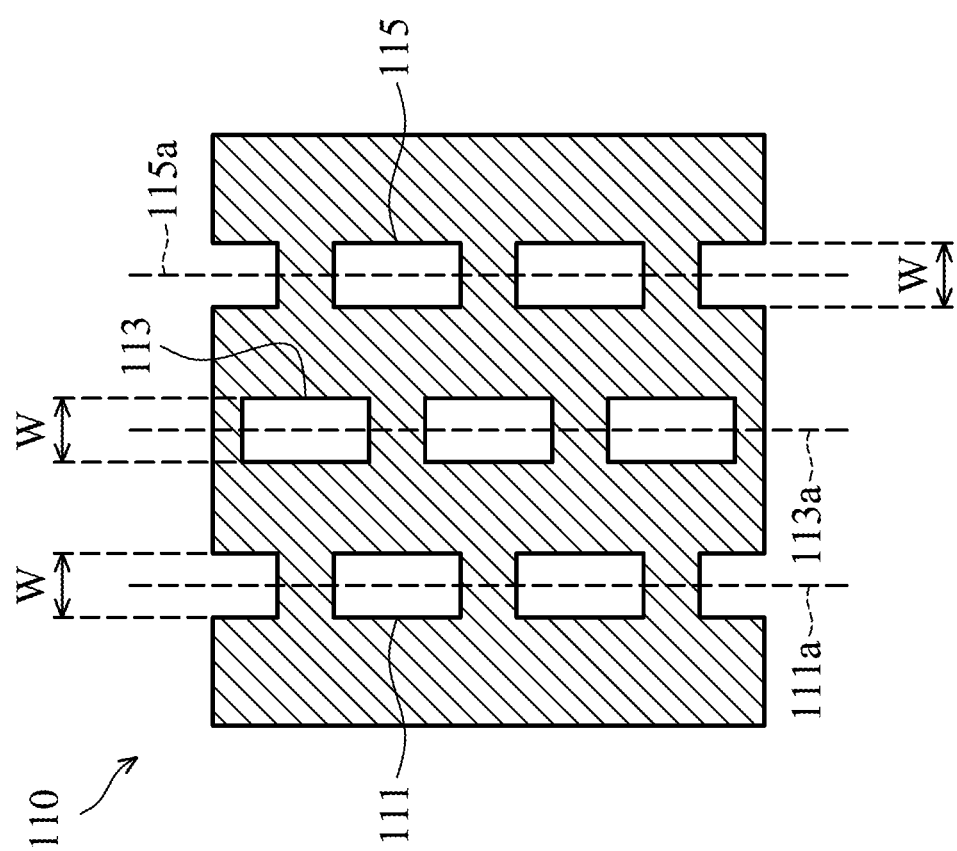
FIG. 4 is a plan view of a test pad according to some embodiments of the present invention.

Refer to shown in FIG. 4, which illustrates a plan view of the test pad 110 according to some embodiments of the present invention. In some embodiments, the test pad 110 and the underlying metal layers are non-solid and include openings arranged in different lines. For example, the test pad 110 includes openings 111 arranged in a line 111a, openings 113 arranged in a line 113a, and openings 115 arranged in a line 115a, in which those lines 111, 113, and 115 are parallel to each other and parallel to an extending direction of the scribe line region 101.

In some embodiments, the openings 113 are shifted with respect to the openings 111 and 115 along a direction that is parallel to the line 113a, so that each of the openings 113 overlaps two openings 111 and two openings 115 as viewed from a direction perpendicular to the lines 111a, 113a, and 115a. Moreover, in some embodiments, the openings 111, 113, and 115 are rectangular-shaped and have a width W that is less than half of the maximum width of the contact area (not shown) between the test pad 110 and the test probe head. As a result, it can be ensured that the test probe head is capable of contacting the solid portion of the test pad 111, so as to prevent failure during testing. Moreover, the openings 111, 113, and 115 are filled with the dielectric layer 108 and therefore the stress generated by the dicing process can be mitigated, so as to prevent cracks from extending into the seal ring region 102 and the chip region 103. Additionally, when the width of the scribe line region 101 is reduced for reduction of the size of the test pad structures 110a, 110b, 110c, and 110d, the speed of dicing the semiconductor wafer 10 can be increased by the use of the test pad 111 with openings 111, 113, and 115 compared to the use of a solid test pad.

It should be understood that the number of openings in the test pad 111 is based on the size of the test pad 111 and is not limited to the embodiment shown in FIG. 4.

In some embodiments, the test elements 120a and 120b (such as transistors, diodes, resistors, capacitors, or an element parameter-extraction module) are electrically connected to the test pad structures 110a, 110b, 110c, and 110d via traces. For example, the test element 120a is electrically connected to the test pad structures 110a and 110b, and the test element 120b is electrically connected to the test pad structures 110c and 110d.

In some embodiments, the semiconductor wafer 10 with a test key structure further includes at least two conductive lines 125a and 125b disposed in the dielectric layer 108 over the semiconductor substrate 105 corresponding to the seal ring region 102. Those conductive lines 125a and 125b serve as the traces between the test elements 120a and 120b and the test pad structures 110a, 110b, 110c, and 110d. For example, two ends of the conductive line 125a extend to the scribe line region 101 from the seal ring region 102, and electrically connected between the test pad structure 110a and the test element 120a. Moreover, two ends of the conductive line 125b extend to the scribe line region 101 from the seal ring region 102, and electrically connected between the test pad structure 110c and the test element 120b. In some embodiments, the conductive lines 125a and 125b may be located in the same level of the dielectric layer 108. Alternatively, the conductive lines 125a and 125b may be located in the different levels of the dielectric layer 108. In those cases, the conductive line 125a may be interlaced with the conductive line 125b. In some embodiments, the conductive lines 125a and 125b may be replaced by the metal layers located in the different levels of the dielectric layer 108 and the conductive plugs that connect these metal layers.

In some embodiments, the semiconductor wafer 10 with a test key structure further includes two seal ring structures 130 and 140 disposed in the dielectric layer 108 over the semiconductor substrate 105 corresponding to the seal ring region 102. In some embodiments, the seal ring structure 130 surrounds the seal ring structure 140 and the seal ring structure 140 surrounds the chip region 103. The seal ring structure 140 typically has a width greater than that of the seal ring structure 130. The seal ring structures 130 and 140 are formed of multi-metal layer structures, as shown in FIG. 3, and are used for protection of integrated circuits 104 in the chip region 103. In some embodiments, the integrated circuits 104 include memory arrays, peripheral driving circuits, or control circuits.

In some embodiments, the conductive lines 125a and 125b may be between the seal ring structures 130 and 140. Unlike the seal ring structure 140 having a continuous ring structure, the seal ring structure 130 may include gaps 130a to form a non-continuous ring structure. Two ends of the conductive line 125a respectively pass through the gaps 130a to extend to the scribe line region 101, so as to respectively and electrically connect the test pad structure 110a and the test element 120a. Similarly, two ends of the conductive line 125b respectively pass through the gaps 130a to extend to the scribe line region 101, so as to respectively and electrically connect the test pad structure 110c and the test element 120b.

Figure 5:
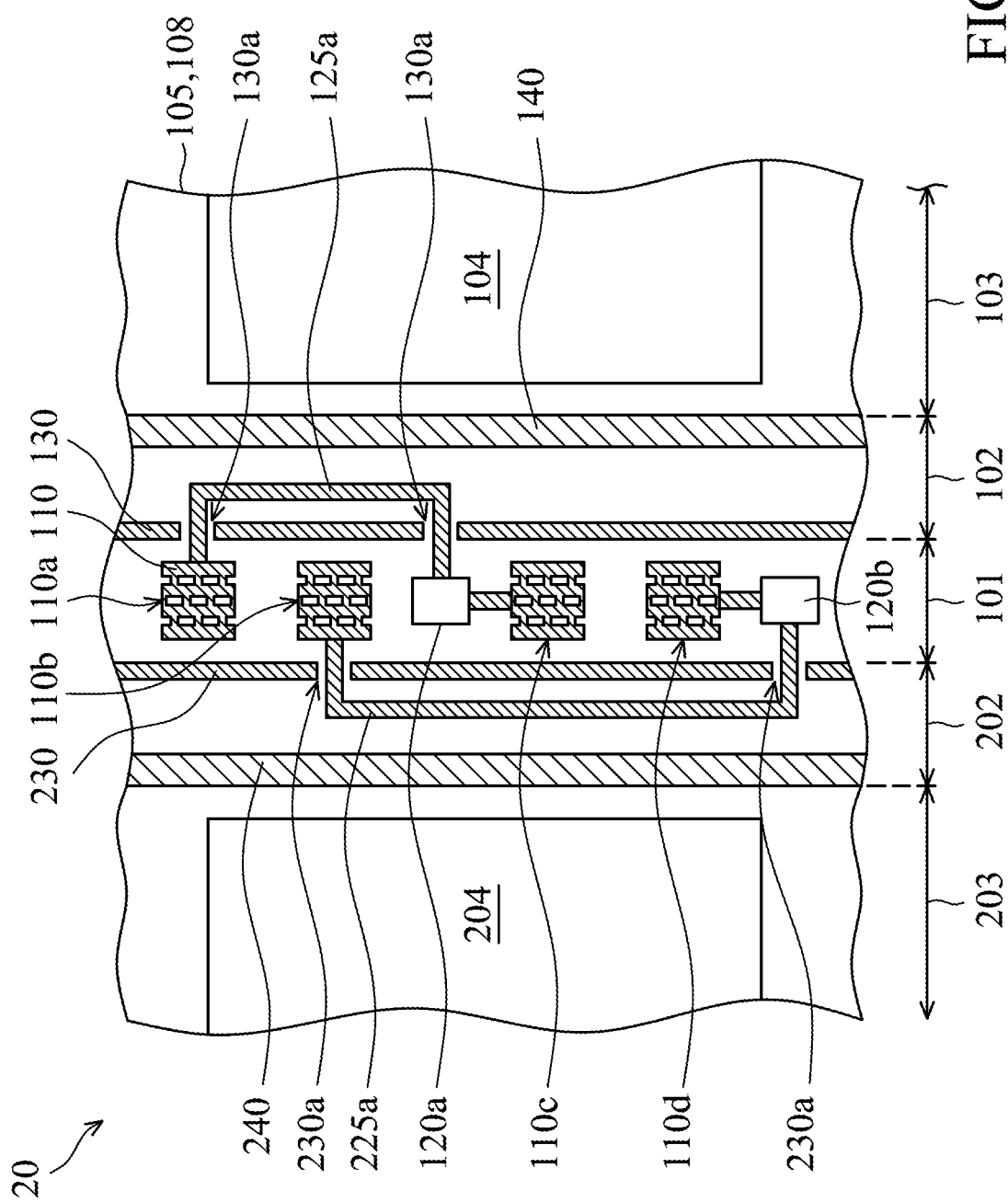
FIG. 5 is a plan view of a portion of a semiconductor wafer with a test key structure according to some embodiments of the present invention.

Refer to FIG. 5, which illustrates a plan view of a portion of a semiconductor wafer 20 with a test key structure according to some embodiments of the present invention. Elements in FIG. 5 that are the same as those in FIG. 1 are labeled with the same reference numbers as in FIG. 1 and may not be described again for brevity. As shown in FIG. 5, the semiconductor wafer 20 is similar to the semiconductor wafer 10 shown in FIG. 1. In some embodiments, the semiconductor wafer 20 with a test key structure includes a semiconductor substrate 105. The semiconductor substrate 105 may include a scribe line region 101, seal ring regions 102 and 202, and chip regions 103 and 203. The scribe line region 101 may be interposed between the seal ring regions 102 and 202. Moreover, the seal ring region 102 surrounds the chip region 103 and the seal ring region 202 surrounds the chip region 203.

In some embodiments, the semiconductor wafer 20 with a test key structure further includes test elements 120a and 120b. Unlike the test key structure of the semiconductor wafer 10 shown in FIG. 1, the test element 120a is electrically connected to the test pad structures 110a and 110c and the test element 120b is electrically connected to the test pad structures 110b and 110d.

Compared to the semiconductor wafer 10 with a test key structure, the semiconductor wafer 20 with a test key structure further includes a conductive line 225a. The conductive line 225a may be disposed in the dielectric layer 108 over the semiconductor substrate 105 corresponding to the seal ring region 202. In some embodiments, two ends of the conductive line 225a extend to the scribe line region 101 from the seal ring region 202, and electrically connected between the test pad structure 110b and the test element 120b. In some embodiments, the conductive lines 125a and 225a are located in the same level of the dielectric layer 108. In some other embodiments, the conductive lines 125a and 225a are located in the different levels of the dielectric layer 108. In some embodiments, the conductive lines 125a and 225a may be replaced by the metal layers located in the different levels of the dielectric layer 108 and the conductive plugs that connect these metal layers.

In some embodiments, compared to the semiconductor wafer 10 with a test key structure, the semiconductor wafer 20 with a test key structure further includes seal ring structures 230 and 240 disposed in the dielectric layer 108 over the semiconductor substrate 105 corresponding to the seal ring region 202. In some embodiments, the seal ring structure 230 surrounds the seal ring structure 240 and the seal ring structure 240 surrounds the chip region 203. The seal ring structure 240 typically has a width greater than that of the seal ring structure 230. The seal ring structures 230 and 240 are formed of multi-metal layer structures, and are used for protection of integrated circuits 204 in the chip region 203. In some embodiments, the integrated circuits 204 include memory arrays, peripheral driving circuits, or control circuits.

In some embodiments, the conductive line 225a may be between the seal ring structures 230 and 240. Unlike the seal ring structures 140 and 240 having a continuous ring structure, the seal ring structure 130 may include two gaps 130a to form a non-continuous ring structure. Moreover, the seal ring structure 230 may include two gaps 230a to form a non-continuous ring structure. Two ends of the conductive line 125a respectively pass through the gaps 130a to extend to the scribe line region 101, so as to be electrically connected between the test pad structure 110a and the test element 120a. Similarly, two ends of the conductive line 225a respectively pass through the gaps 230a to extend to the scribe line region 101, so as to be electrically connected between the test pad structure 110b and the test element 120b.

Figure 6:
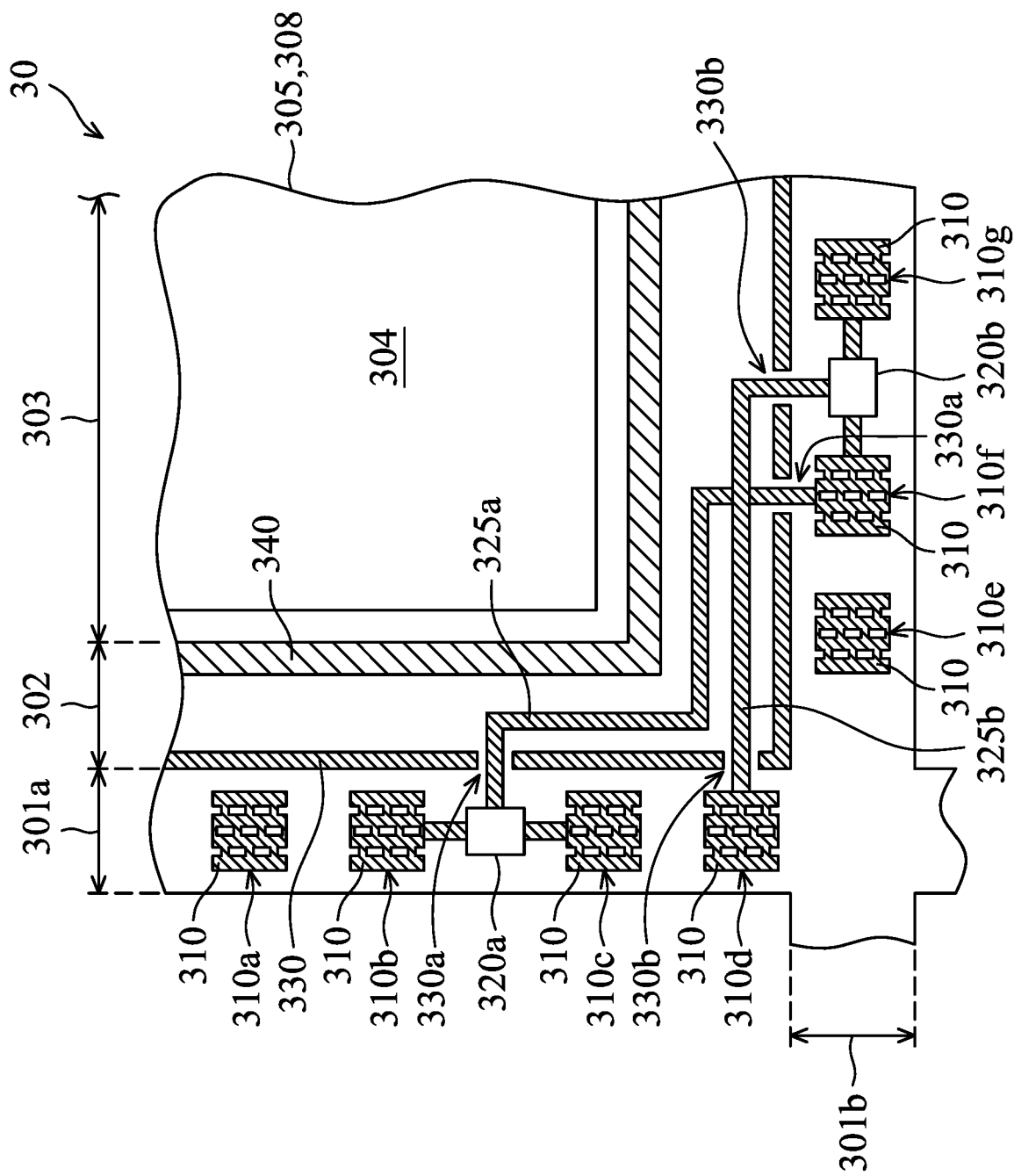
FIG. 6 is a plan view of a portion of a semiconductor wafer with a test key structure according to some embodiments of the present invention.

Refer to FIG. 6, which illustrates a plan view of a portion of a semiconductor wafer 30 with a test key structure according to some embodiments of the present invention. In some embodiments, the semiconductor wafer 30 includes a semiconductor substrate 305. The material and the structure of the semiconductor substrate 305 are the same as or similar to those of the semiconductor substrate 105 shown in FIG. 1. The semiconductor substrate 305 may include two scribe line regions 301a and 301b, a seal ring region 302 adjacent to the scribe line regions 301a and 301b, and a chip region 303 adjacent to the seal ring region 302. In some embodiments, the scribe line region 301a may be perpendicular to the scribe line region 301b. Moreover, the seal ring region 302 is between the two scribe line regions 301a and 301b and the chip region 303 and surrounds the chip region 303.

In some embodiments, the semiconductor wafer 30 with a test key structure further includes test pad structures and test elements disposed in the dielectric layer 303 over the semiconductor substrate 305 corresponding to the scribe line regions 301a and 301b. The material and the structure of the dielectric layer 308 may be the same as or similar to those of the dielectric layer 108 shown in FIGS. 1 to 3.

Herein, in order to simplify the diagram, only four test pad structures 310a, 310b, 310c, and 310d and a test element 320a in the scribe line region 301a, and three test pad structures 310e, 310f, and 310g and a test element 320b in the scribe line region 301b are depicted. In some embodiments, the material and the structure of the test pad structures 310a to 310g may be the same as or similar to the test pad structures 110a to 110d shown in FIGS. 1 to 3, and the material and the structure of the test elements 320a and 320b may be the same as or similar to the test elements 120a and 120b shown in FIG. 1. Similarly, the test pad structures 310a to 310g respectively include metal layers in different levels of the dielectric layer 308 and conductive plugs connected between the metal layers. The uppermost metal layer in the stack of the metal layers may serve as a test pad 310 for contacting a test probe head (not shown). In some embodiments, the structure of the test pad 310 may be the same as that of the test pad 110 shown in FIG. 4.

In some embodiments, the test elements 320a and 320b are electrically connected to the test pad structures 310b, 310c, 310d, 310f, and 310g by traces. For example, the test element 320a may be electrically connected to the test pad structures 310b, 310c, and 310f, and the test element 320b may be electrically connected to the test pad structures 310d and 310g.

In some embodiments, the semiconductor wafer 30 with a test key structure further includes at least two conductive lines 325a and 325b disposed in the dielectric layer 308 over the semiconductor substrate 305 corresponding to the seal ring region 302. Those conductive lines 325a and 325b serve as the traces between the test elements 320a and 320b and the test pad structures 310a to 310g. For example, two ends of the conductive line 325a extend to the scribe line region 301 from the seal ring region 302, and electrically connected between the test pad structure 310a and the test element 320f. Moreover, two ends of the conductive line 325b extend to the scribe line region 301 from the seal ring region 302, and electrically connected between the test pad structure 310d and the test element 320b. In some embodiments, the conductive lines 325a and 325b may be located in the different levels of the dielectric layer 308. In those cases, the conductive line 325a may be interlaced with the conductive line 325b, as shown in FIG. 6. In some other embodiments, the conductive lines 325a and 325b may be located in the same level of the dielectric layer 308. In some embodiments, the conductive lines 325a and 325b may be replaced by the metal layers located in the different levels of the dielectric layer 308 and the conductive plugs that connect these metal layers.

In some embodiments, the semiconductor wafer 30 with a test key structure further includes two seal ring structures 330 and 340 disposed in the dielectric layer 308 over the semiconductor substrate 305 corresponding to the seal ring region 302. In some embodiments, the seal ring structure 330 surrounds the seal ring structure 340 and the seal ring structure 340 surrounds the chip region 303. The seal ring structure 340 typically has a width greater than that of the seal ring structure 330. The material and the structure of the seal ring structures 330 and 340 are respectively the same as or similar to those of the seal ring structures 130 and 140 shown in FIG. 3, and are used for protection of integrated circuits 304 in the chip region 303. In some embodiments, the integrated circuits 304 include memory arrays, peripheral driving circuits, or control circuits.

In some embodiments, the conductive lines 325a and 325b may be between the seal ring structures 330 and 340. Unlike the seal ring structure 340 having a continuous ring structure, the seal ring structure 330 may include gaps to form a non-continuous ring structure. For example, the seal ring structure 330 may include two gaps 330a respectively corresponding to the scribe line region 310a and the scribe line region 310b and two gaps 330b respectively corresponding to the scribe line region 310a and the scribe line region 310b. Two ends of the conductive line 325a respectively pass through the gaps 330a to extend to the scribe line region 301b and the scribe line region 301a, so as to respectively and electrically connect the test pad structure 310f and the test element 320a. Similarly, two ends of the conductive line 325b respectively pass through the gaps 330b to extend to the scribe line region 301a and the scribe line region 301b, so as to respectively and electrically connect the test pad structure 310d and the test element 320b.

According to the foregoing embodiments, the traces that are used for the test key structure are disposed in the seal ring region between the scribe line region and the chip region. Moreover, the size of the test pad of the test key structure is reduced. Therefore, the design flexibility of those traces can be increased and the width of the scribe line region can be effectively reduced. For example, the distance from two opposite edges of the test pad to the edge of the corresponding scribe line region can be reduced to about 1 µm. As a result, the available area on the wafer can be increased, thereby increasing the gross die per wafer.

While the disclosure has been described by way of example and in terms of the preferred embodiments, it should be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor wafer with a test key structure, comprising: a semiconductor substrate comprising a scribe line region, a chip region, and a seal ring region between the scribe line region and the chip region; a first test pad structure and a first test element disposed over the semiconductor substrate corresponding to the scribe line region; and a first conductive line disposed over the semiconductor substrate corresponding to the seal ring region, and having two ends extending to the scribe line region and electrically connected between the first test pad structure and the first test element, wherein the first pad structure comprises a test pad to contact a test probe head, and wherein the test pad comprises: a plurality of first openings arranged in a first line; and a plurality of second openings arranged in a second line that is parallel to the first line, wherein the plurality of second openings are shifted with respect to the plurality of first openings along a direction that is parallel to the second line.

2. The semiconductor wafer as claimed in claim 1, wherein each first opening and each second opening are rectangular and have a width that is less than half of a maximum width of a contact area between the test pad and the test probe head.

3. The semiconductor wafer as claimed in claim 1, further comprising:
a second test pad structure and a second test element disposed over the semiconductor substrate corresponding to the scribe line region; and
a second conductive line disposed over the semiconductor substrate corresponding to the seal ring region, and having two ends extending to the scribe line region and electrically connected between the second test pad structure and the second test element.

4. The semiconductor wafer as claimed in claim 3, wherein the first conductive line and the second conductive line are disposed in the same level or different levels of a dielectric layer over the semiconductor substrate.

5. The semiconductor wafer as claimed in claim 3, further comprising a first seal ring structure and a second seal ring structure disposed over the semiconductor substrate corresponding to the seal ring region, wherein the first conductive line and the second conductive line are disposed between the first seal ring structure and the second seal ring structure, and wherein the first seal ring structure comprises a plurality of gaps to form a non-continuous ring structure, and the first conductive line and the second conductive line pass through the plurality of gaps to extend to the scribe line region.

6. The semiconductor wafer as claimed in claim 5, wherein the first seal ring structure surrounds the second seal ring structure, and the second seal ring structure surrounds the chip region.

7. The semiconductor wafer as claimed in claim 3, wherein the second pad structure comprises a test pad to contact a test probe head, and wherein the test pad comprises:
a plurality of first openings arranged in a first line; and
a plurality of second openings arranged in a second line that is parallel to the first line, wherein the plurality of second openings are shifted with respect to the plurality of first openings along a direction that is parallel to the second line.

8. The semiconductor wafer as claimed in claim 6, wherein each first opening and each second opening are rectangular and have a width that is less than half of a maximum width of a contact area between the test pad and the test probe head.

9. A semiconductor wafer with a test key structure, comprising: a semiconductor substrate comprising a first seal ring region, a second seal ring region, and a scribe line region between the first seal ring region and the second seal ring region; a first test pad structure, a second test pad structure, a first test element, and a second test element disposed over the semiconductor substrate corresponding to the scribe line region; a first conductive line disposed over the semiconductor substrate corresponding to the first seal ring region, and having two ends extending to the scribe line region and electrically connected between the first test pad structure and the first test element; and a second conductive line disposed over the semiconductor substrate corresponding to the second seal ring region, and having two ends extending to the scribe line region and electrically connected between the second test pad structure and the second test element, wherein a first seal ring structure and a second seal ring structure disposed over the semiconductor substrate corresponding to the first seal ring region, wherein the first conductive line is disposed between the first seal ring structure and the second seal ring structure, and wherein the first seal ring structure comprises two first gaps to form a non-continuous ring structure, and the first conductive line passes through the first gaps to extend to the scribe line region; and a third seal ring structure and a fourth seal ring structure disposed over the semiconductor substrate corresponding to the second seal ring region, wherein the second conductive line is disposed between the third seal ring structure and the fourth seal ring structure, and wherein the third seal ring structure comprises two second gaps to form a non-continuous ring structure, and the second conductive line passes through the second gaps to extend to the scribe line region.

10. The semiconductor wafer as claimed in claim 9, wherein the first conductive line and the second conductive line are disposed in the same level or different levels of a dielectric layer over the semiconductor substrate.

11. The semiconductor wafer as claimed in claim 9, wherein the semiconductor substrate further comprises a first chip region and a second chip region, and wherein the first seal ring region surrounds the first chip region and the second seal ring region surrounds the second chip region.

12. The semiconductor wafer as claimed in claim 11, wherein the first seal ring structure surrounds the second seal ring structure and the third seal ring structure surrounds the fourth seal ring structure.

13. The semiconductor wafer as claimed in claim 9, wherein the first pad structure and the second pad structure respectively comprise a test pad to contact a test probe head, and wherein the test pad comprises:
   a plurality of first openings arranged in a first line; and
   a plurality of second openings arranged in a second line that is parallel to the first line, wherein the plurality of second openings are shifted with respect to the plurality of first openings along a direction that is parallel to the second line.

14. The semiconductor wafer as claimed in claim 13, wherein each first opening and each second opening are rectangular and have a width that is less than half of a maximum width of a contact area between the test pad and the test probe head.

15. A semiconductor wafer with a test key structure, comprising: a semiconductor substrate comprising a first scribe line region, a second scribe line region perpendicular to the first scribe line region, and a seal ring region between the first scribe line region and the second scribe line region; a first test pad structure and a first test element disposed over the semiconductor substrate corresponding to the first scribe line region; a second test pad structure and a second test element disposed over the semiconductor substrate corresponding to the second scribe line region; a first conductive line disposed over the semiconductor substrate corresponding to the seal ring region, and having two ends respectively extending to the first scribe line region and the second scribe line region, and electrically connected between the first test element and the second test pad structure; and a second conductive line disposed over the semiconductor substrate corresponding to the seal ring region, and having two ends respectively extending to the first scribe line region and the second scribe line region, and electrically connected between the first test pad structure and the second test element, wherein the first pad structure and the second pad structure respectively comprise a test pad to contact a test probe head, and wherein the test pad comprises: a plurality of first openings arranged in a first line; and a plurality of second openings arranged in a second line that is parallel to the first line, wherein the plurality of second openings are shifted with respect to the plurality of first openings along a direction that is parallel to the second line, and wherein each first opening and each second opening are rectangular and have a width that is less than half of a maximum width of a contact area between the test pad and the test probe head.

16. The semiconductor wafer as claimed in claim 15, wherein the first conductive line and the second conductive line are disposed in different levels of a dielectric layer over the semiconductor substrate.

17. The semiconductor wafer as claimed in claim 15, further comprising:
   a first seal ring structure and a second seal ring structure disposed over the semiconductor substrate corresponding to the seal ring region;
   wherein the first seal ring structure surrounds the second seal ring structure and comprises two first gaps respectively corresponding to the first scribe line region and the second scribe line region, and two second gaps respectively corresponding to the first scribe line region and the second scribe line region to form a non-continuous ring structure; and
   wherein the first conductive line passes through the first gaps to extend to the first scribe line region and the second scribe line region, and the second conductive line passes through the second gaps to extend to the first scribe line region and the second scribe line region.

* * * * *